United States Patent
Iwao et al.

(10) Patent No.: US 6,355,948 B2
(45) Date of Patent: *Mar. 12, 2002

(54) SEMICONDUCTOR INTEGRATED CIRCUIT DEVICE

(75) Inventors: Takenobu Iwao; Ryuichi Sakano, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/413,750

(22) Filed: Oct. 6, 1999

(30) Foreign Application Priority Data

Jun. 11, 1999 (JP) .......................... 11-165808

(51) Int. Cl.⁷ .......................... H01L 27/10; H01L 29/76
(52) U.S. Cl. .......................... 257/207; 257/143; 257/147; 257/202; 257/207; 257/208; 257/153; 257/375; 257/386; 257/401; 438/128; 438/129; 438/587; 438/598
(58) Field of Search .......................... 257/401, 375, 257/153, 386, 143, 147, 372, 369, 206, 207, 202, 208; 438/128, 129, 587, 598

(56) References Cited

U.S. PATENT DOCUMENTS 6,140,686 A * 10/2000 Mizuno et al. ............. 257/369

FOREIGN PATENT DOCUMENTS

| JP | 4-267553 | 9/1992 |
| JP | 7-78949 | 3/1995 |
| JP | 8-222640 | 8/1996 |

* cited by examiner

Primary Examiner—Tom Thomas
Assistant Examiner—Donghee Kang
(74) Attorney, Agent, or Firm—Burns, Doane, Swecker & Mathis, LLP

(57) ABSTRACT

There is provided a semiconductor integrated circuit device having a macro cell structure including: a rectangular macro cell region formed on a semiconductor substrate; a first diffusion region having the minimum permissible width, formed apart at least by a minimum inter-diffusion distance from both left and right side ends in upper and lower sides of the macro cell region, and formed in the vicinity of both upper and lower ends of the macro cell region; and a second diffusion region in which a well contact is formed. The first diffusion region is electrically connected with the second diffusion region.

9 Claims, 6 Drawing Sheets

SEMICONDUCTOR INTEGRATED CIRCUIT DEVICE

BACKGROUND OF THE INVENTION

1. Field of the Invention

The present invention relates to a semiconductor integrated circuit device having a macro cell structure with a cell-base well contact.

2. Description of the Prior Art

FIG. 8 is a layout diagram of a prior art semiconductor integrated circuit device having a macro cell structure with a well contact, for example, disclosed in JP-A-04/267553. FIG. 9 is an enlarged view in left-part in the semiconductor integrated circuit device of FIG. 8. FIG. 10 is a sectional view taken along II–II' line of FIG. 9.

In the drawings, reference numerals 101a, 101b each denote well contacts, numeral 2 denotes a diffusion region, numeral 3 denotes a rectangular cell frame of a macro cell, numeral 11 denotes a p-type semiconductor substrate such as Si, numeral 12 denotes a p-well, numeral 13 denotes an n-well, numeral 14 denotes an oxide film, numerals 115a, 115b each denote a p+ diffusion region, numerals 116a, 116b each denote an n+ diffusion region, numerals 17a, 17b each denote a contact which connects a ground wiring 18a and a power supply line 18b to the p+ diffusion region 115a and the n+ diffusion region 116b, respectively, numerals 18a, 18b denote the ground wiring for supplying ground voltage GND (0V), and the power supply wiring for supplying power supply voltage VDD (1.8V) respectively, both of which are made of metal such as aluminum, symbol A designates an area having a large contact effect, and symbol B designates an area having a small contact effect. Here, the respective combinations of the diffusion regions 115a, 115b with the contacts 17a, 17b are defined as the well contacts 101a, 101b.

In general, when a cell-base semiconductor integrated circuit device has a CMOS structure, the n-well 13 is enhanced to the power supply voltage VDD, and the p-well 12 is set to the ground voltage GND so as to prevent latchup. Therefore, the power supply wiring 18b is electrically connected to the n-well region 13 through the n+ diffused region 116b, while the power supply wiring 18a is electrically connected to the p-well region 12 through the p+ diffused region 115a. However, the presence of the latchup means that in semiconductor integrated circuit devices having a CMOS structure and so on, a phenomenon is caused in which the ON state of a parasitic thyristor formed by parasitic bipolar PNP, NPN transistors nearly causes a short state between power supply and ground. This results not only in abnormal operation but also element malfunction.

The layout diagram of FIG. 8 shows the diffusion region 2 in which transistors are constituted in the cell frame 3 of the macro cell, and the well contacts 101a, 101b. In recent years, to achieve a high density in cell bases, there has been a tendency to fabricate macro cells of a smaller size as a circuit unit. For this reason, the well contacts 101a, 101b described above have been arranged between the diffusion regions 2 in which transistors are constituted.

The operation will be next described.

On the side of ground voltage supplying, the ground voltage GND is provided in the p+ diffusion region 115a via the contact 17a, and the ground voltage 0V is provided in the p-type semiconductor substrate 11 via the p-well 12. On the other hand, on the side of power supply voltage supplying, the power supply voltage VDD is provided in the n+ diffusion region 116b from the power supply wiring 18b via the contact 17b, to be transferred in the n-well region 13. However, from the n-well 13 to the p-type semiconductor substrate 11, the power supply voltage VDD is provided in the former, while the ground voltage GND is provided in the latter, which leads to a "reverse-biased" condition to diodes in which no current flows.

Incidentally, JP-A-08/222640 discloses a semiconductor integrated circuit device having an improved latchup resistant cell. In addition, JP-A-07/78949 discloses a semiconductor integrated circuit in which a silicide structure is provided in the upper surface of a diffusion region, and is used for power and ground regions.

SUMMARY OF THE INVENTION

Since a semiconductor integrated circuit device having a macro cell structure has the above structure in the prior art as described above, there is a problem that since the well contacts 101a, 101b cannot be formed on the whole surface of the macro cell, the region A having a large well contact effect occurs at a place near the well contacts 101a, 101b, while the region B having a small well contact effect occurs at a place far from the well contacts 101a, 101b.

The present invention has been made to solve the above-described problem, and it is an object of the present invention to obtain a semiconductor integrated device having an improved latchup resistant macro cell structure such that even when a macro cell with just partially taken contacts is used, the well contact effect spreads over a wider area, e.g., the whole macro cell.

According to the present invention, a macro cell structure comprises: a first diffusion region having the minimum permissible width, formed apart at least by the minimum inter-diffusion distance from both left and right side ends in upper and lower sides of a rectangular macro cell region, and formed in the vicinity of both upper and lower ends of the macro cell region; and a second diffusion region in which a well contact is formed, wherein the first diffusion region is electrically connected with the second diffusion region. Thus, the well contact effect provided in the second diffusion region spreads over the first diffusion region electrically connected therewith, thereby improving latchup resistance over a wider range of the macro cell.

According to the present invention, a macro cell structure comprises: a first diffusion region having the minimum permissible width, formed from at least one of both left and right side ends in upper and lower sides of a rectangular macro cell region, and formed in the vicinity of both upper and lower ends of the rectangular macro cell region; and a second diffusion region in which a well contact is formed, wherein the first diffusion region is electrically connected with the second diffusion region. Thus, even if adjoining macro cells have no well contacts at the left and right sides of the above macro cell, the adjoining macro cells are brought in contact and electrically connected with each other, thereby receiving the well contact effect. Therefore, since the well contact effect may be rendered to not only macro cells having well contacts but also macro cells having no well contacts, the latchup resistance of the whole semiconductor integrated circuit device may be improved.

According to the present invention, a second macro cell structure having no well contacts includes: a third diffusion region having a minimum permissible width, formed from at least one of both left and right side ends in upper and lower sides of the rectangular macro cell region, and formed in the vicinity of both upper and lower ends of the macro cell region, wherein when the macro cell structure is disposed at at least any one of left and right sides of the second macro cell structure, the first diffusion region is electrically connected with the third diffusion region in upper side and/or lower side of the macro cell region. Thus, the well contact effect may be also rendered to the macro cell having no well contacts, thereby improving latchup resistance over the whole semiconductor integrated circuit device.

According to the present invention, a macro cell structure comprises: a fourth diffusion region having half or more of the minimum permissible width, formed from at least one of both left and right side ends in upper and lower sides of the rectangular macro cell region, and formed in the vicinity of both upper and lower ends of the macro cell region; and a second diffusion region in which a well contact is formed, wherein the first diffusion region is electrically connected with the second diffusion region. Thus, the micro cell structures are vertically brought in contact and electrically connected with each other, so that a width of the combined diffusion region satisfies the minimum permissive width. With this manner, the well contact effect may be rendered to a wider range of the macro cell, and further the macro cell may be shrunk since a poly-wiring region such as polycrystalline silicon in the macro cell widens, resulting in a high density of the semiconductor integrated circuit device in addition to the above-mentioned improvement of the latchup resistance.

According to the present invention, a plurality of the macro cell structures each are provided with fifth diffusion regions as follows: the fourth diffusion regions are electrically connected with each other at upper and lower sides of said macro cell region, the fifth diffusion region satisfying the minimum permissible width, thereby resulting in the improvement of the latchup resistance and high-density of the device.

According to the present invention, the fifth diffusion regions are electrically connected with each other at left and right sides of the macro cell region. Thus, the well contact effect spreads throughout not only the relating macro cell but also the whole semiconductor integrated circuit device, thereby resulting in the improvement of the latchup resistance and high density of the device.

According to the present invention, the plurality of macro cell structures include a macro cell structure having no well contacts. Thus, the well contact effect spreads over the macro cell having no well contacts, thereby resulting in improvement of the latchup resistance and high density of the whole device likewise.

According to the present invention, at least one of the first to fifth diffusion regions is made of a salicide structure of a refractory metal to reduce electric resistance of these surface layers. Thus, the well contact effect may spread over the whole device more effectively through the diffusion region connected with the well contact. In addition, since the minimum permissible width itself may be reduced, an area of the macro cell may also be reduced, thereby resulting in improvement of the latchup resistance and high density of the device.

According to the present invention, since the minimum permissible width of the first, third, fourth and fifth diffusion regions is not allowed to be disposed with a well contact, resulting in a high density of the device due to wider poly-wiring regions in the macro cell.

DETAILED DESCRIPTION OF THE PREFERRED EMBODIMENTS

An embodiment of the present invention will be described below.

Embodiment 1

Figure 1:
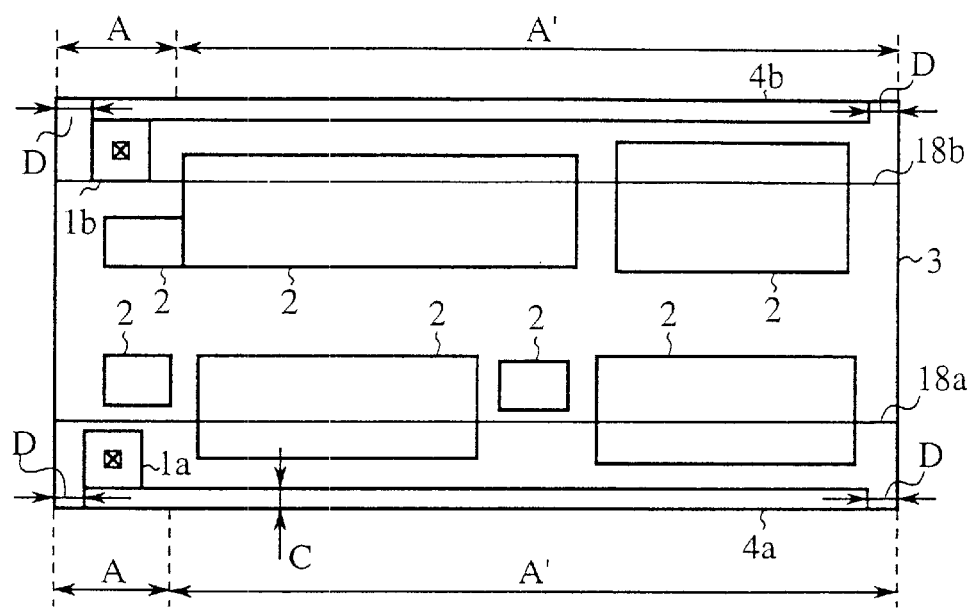
FIG. 1 is a layout diagram showing a semiconductor integrated circuit device having a macro cell structure according to Embodiment 1 of the invention.
Figure 2:
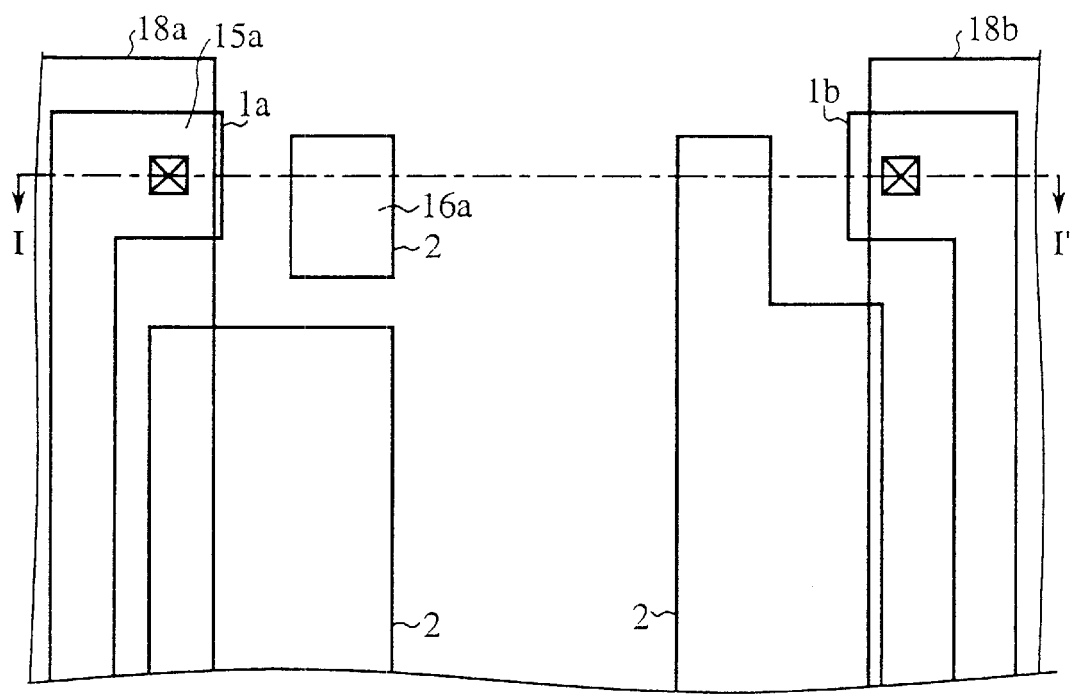
FIG. 2 is an enlarged view in left-part of the semiconductor integrated circuit device.
Figure 3:
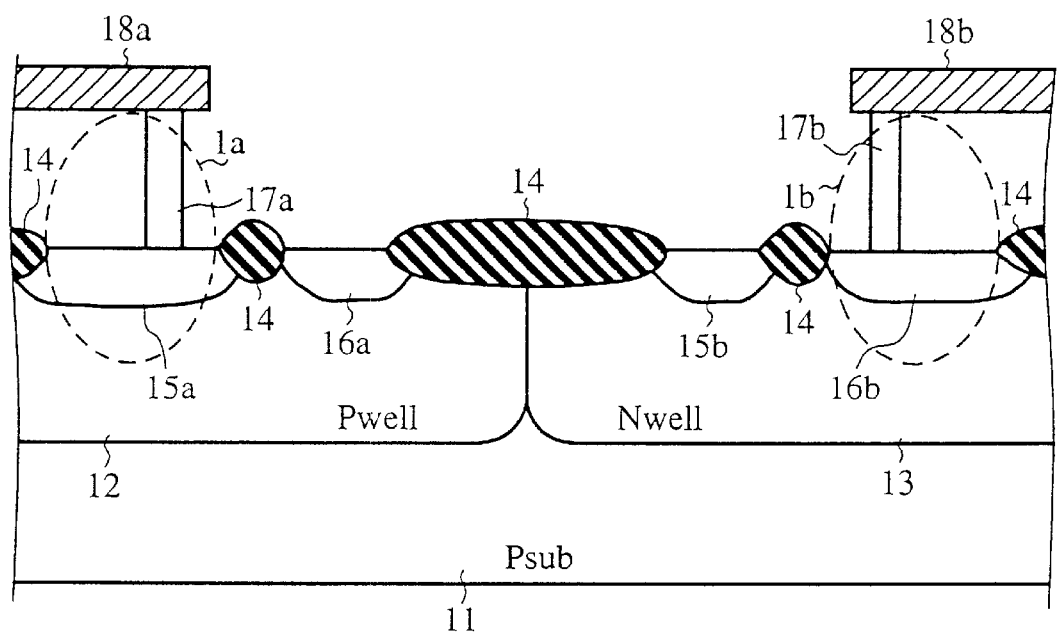
FIG. 3 is a sectional view taken along I–I' line of FIG. 2.

FIG. 1 is a layout diagram showing a semiconductor integrated circuit device having a macro cell structure according to Embodiment 1 of the invention. FIG. 2 is an enlarged view in left-part of the semiconductor integrated circuit device of FIG. 1. FIG. 3 is a sectional view taken along line I–I' of FIG. 2.

In the drawings, reference numerals 1a, 1b each denote a well contact, numeral 2 denotes a diffusion region of transistors, numeral 3 denotes a rectangular cell frame of a macro cell, numerals 4a, 4b each denote an extended diffusion region having the minimum permissible width C on a design rule, numeral 11 denotes a p-type semiconductor substrate such as Si, numeral 12 denotes a p-well, numeral 13 denotes an n-well, numeral 14 denotes an oxide film, numerals 15a, 15b each denote a p+ diffusion region, and numerals 16a, 16b each denote an n+ diffusion region. Further, numerals 17a, 17b each denote a contact which connects a ground wiring 18a, and a power supply wiring 18b to the p+ diffusion region 15a and the n+ diffusion region 15b, respectively, numerals 18a, 18b denote the ground wiring for supplying ground voltage GND (0V), and the power supply wiring for supplying power supply voltage VDD (1.8V), respectively, both of which are made of metal such as aluminum, symbol A designates an area having a large well contact effect, symbol A' designates an area having an improved well contact effect, symbol C designates the minimum permissible width, and symbol D designates an inter-diffusion area. The extended diffusion resions 4a, 4b may be produced like other diffusion regions through typical field isolations. The well contacts 1a, 1b each designate to combinations of the diffusion regions and the contacts, e.g., the combination of the contact 17a and the p+ diffusion region 15a.

In the layout configuration of Embodiment 1, first, the well contacts 1a, 1b are disposed in the vacancy of the diffusion regions of transistors. Second, the diffusion regions 4 having the minimum permissible width C are disposed along the cell frame 3 on the left and right sides of the macro cell. As a result, there is provided a structure that the well contact 1*a* and the diffusion region 4*a* are electrically connected with each other. The minimum permissible width C is on such a level that the disposition of the contacts is not allowed. In this manner, effective layout areas are not restricted unnecessarily.

The operation will be next described.

On one side of supplying the ground voltage GND, the ground voltage GND is provided in the p+ diffusion region 15*a* from the ground wiring 18*a* through the contact 17*a*, in the p+ semiconductor substrate 11 through the p-well 12, and also in the expanded diffusion region 4*a* since the p+ diffusion region 15*a* in the well contact 1*a* is electrically connected with the diffusion region 4*a*.

On the other side of supplying the power supply voltage VDD, the power supply voltage VDD (1.8V) is provided in the n+ diffusion region 16*b* from the power supply wiring 18*b* through the contact 17*b*, and transferred to the N-well 13. However, no current is flowed since a state such that a diode is reverse-biased occurs from the n-well 13 provided with the power supply voltage VDD to the p-type semiconductor substrate 11 provided with the ground voltage GND. In addition, the power supply voltage VDD is also provided in the expanded diffusion region 4*a* since the n+ diffusion region 16*b* in the well contact 1*b* is electrically connected with the diffusion region 4*b*.

Thus, since the effect of the area A having a large well contact is communicated to the area A' electrically connected therewith through the extended diffusion regions 4*a*, 4*b*, the well contact effect is improved even in a place far from the well contacts 1*a*, 1*b* in the macro cell as well as the area A.

As described above, according to Embodiment 1, since the extended diffusion regions 4*a*, 4*b* electrically connected with the well contacts 1*a*, 1*b* are disposed along the upper and lower sides of the cell frame 3, respectively, the well contact effect covers the extended diffusion regions 4*a*, 4*b*, thereby improving latchup resistance over a wider range of the macro cell.

Embodiment 2

Figure 4:
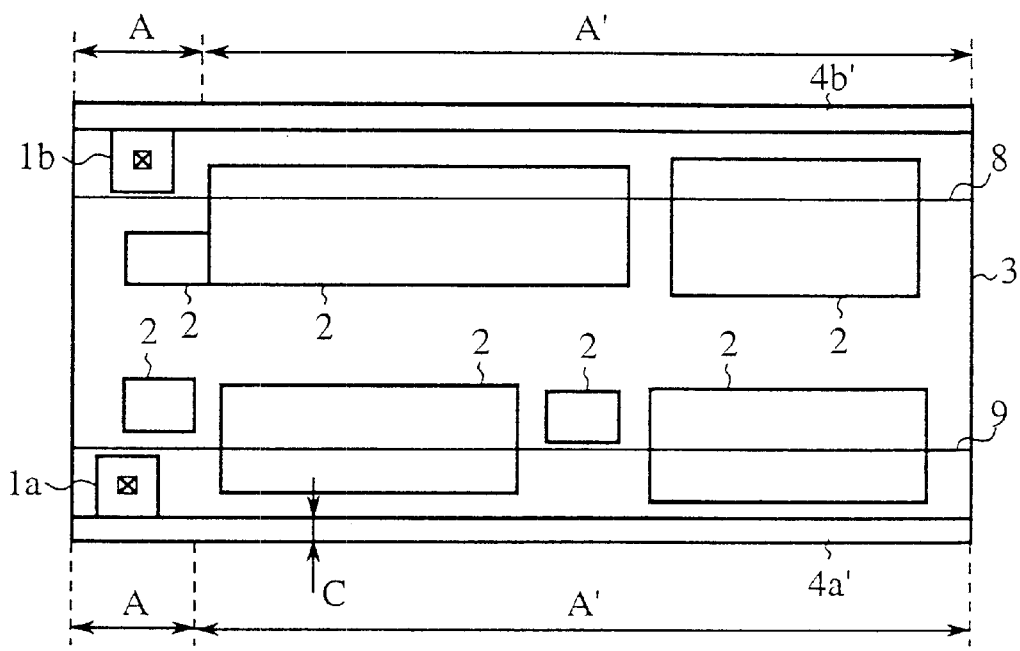
FIG. 4 is a layout diagram showing a semiconductor integrated circuit device having a macro cell structure according to Embodiment 2 of the invention.

FIG. 4 is a layout diagram showing a semiconductor integrated circuit device having a macro cell structure according to Embodiment 2. In the drawing, reference numerals 4*a*', 4*b*' each denote an extended diffusion region having the minimum permissible width C on a design rule, and the same reference numerals above designate the same components or corresponding parts. Their explanation is omitted herein for brevity.

The layout configuration of Embodiment 2 is distinguishable from that of Embodiment 1 in that as compared with the extended diffusion regions 4*a*, 4*b* of the latter, the extended diffusion regions 4*a*', 4*b*' extends to the left and right ends of the cell frame 3, resulting in making the minimum width of the left and right inter-diffusion distance D of the macro cell zero or less. The present Embodiment 2 is the same as the Embodiment 1 in other layout configurations and macro cell structures. Accordingly, a description of their operation is omitted in the simple macro cell. However, a minimum width of zero or less of the inter-diffusion distance D is just a design concept. If such a margin is not prepared in advance, an actually produced semiconductor integrated circuit device may misfunction.

The effect due to the above-structure will be explained, referring to FIG. 5.

Figure 5:
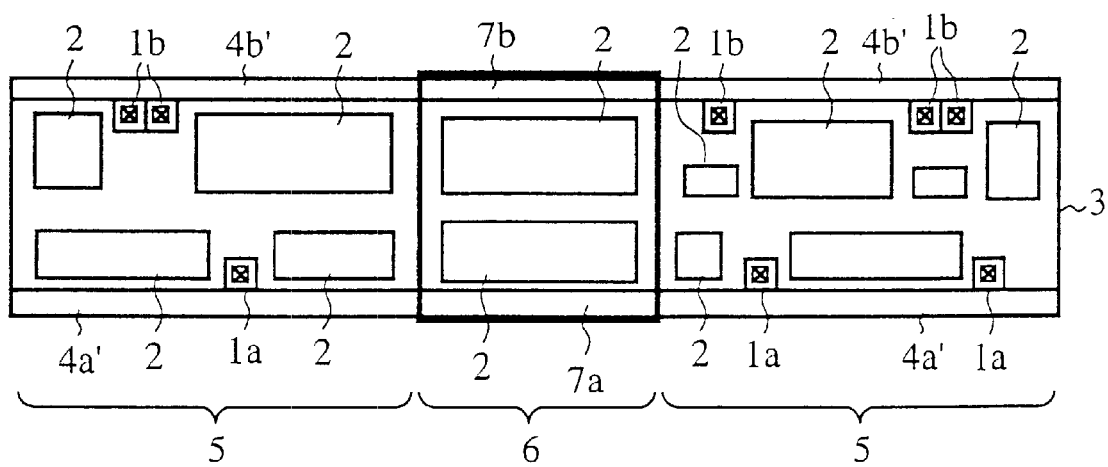
FIG. 5 is a layout diagram showing an application example of Embodiment 2.

FIG. 5 is a layout diagram such that three macro cells are brought in contact with one another by interposing the macro cell structure in FIG. 4 in-between. In the drawing, reference numeral 5 denotes a macro cell having well contacts, numeral 6 denotes a macro cell having no well contacts, numerals 7*a*, 7*b* each denote a diffusion region unrelated to the well contact. FIG. 5 represents a state in which a macro cell 6 having no well contacts is interposed between the two left and right macro cells having well contacts 5. The macro cell having no well contacts 6 herein refers to a restricted macro cell in which well contacts cannot be laid out due to a large occupied area of the diffusion region 2 of transistors.

Since the diffusion regions 7*a*, 7*b* in the macro cell having no well contacts 6 are electrically connected with the extended diffusion regions 4*a*', 4*b*' in the adjoining macro cells having well contacts 5, the diffusion regions of the well contacts 1*a*, 1*b* are electrically connected with the diffusion regions 7*a*, 7*b*, respectively. With this manner, the well contact effect may spread over the macro cells having no well contacts 6; therefore, the latchup resistance may be improved in a wider range of the device.

As described above, according to Embodiment 2, since the extended diffusion regions 4*a*', 4*b*' having the minimum permissible width, formed at the left and right ends and the top and bottom ends of the frame 3, and incapable of disposing contacts for use of well contacts, are constituted to be electrically connected with the well contacts 1*a*, 1*b*, respectively, the well contact effect may spread over other macro cells having no well contacts. As a result, the latchup resistance of the whole semiconductor integrated circuit device may be improved.

Embodiment 3

Figure 6:
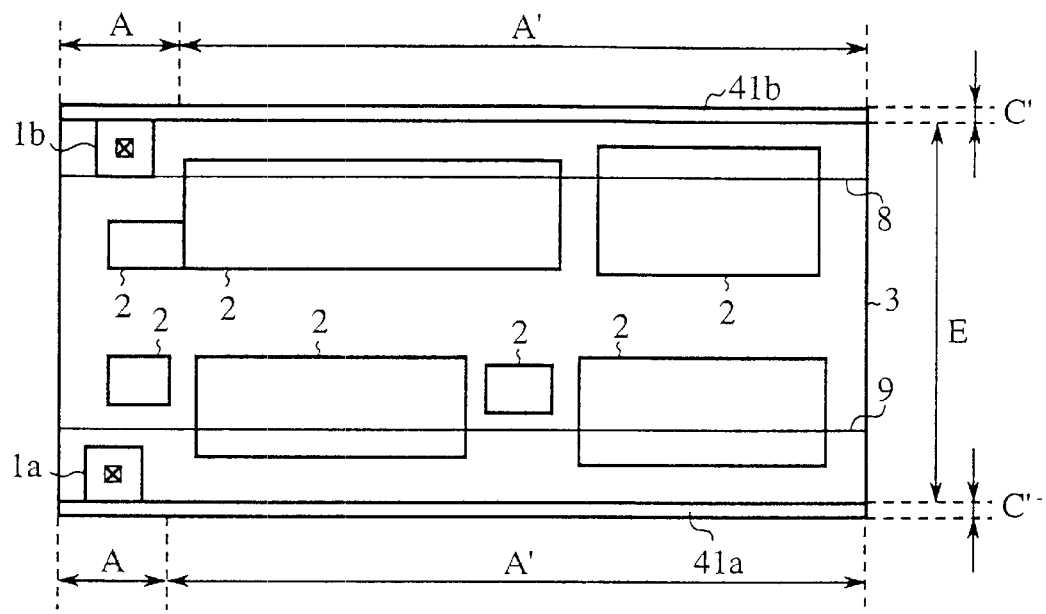
FIG. 6 is a layout diagram showing a semiconductor integrated circuit device having a macro cell structure according to Embodiment 3 of the invention.

FIG. 6 is a layout diagram showing a semiconductor integrated circuit device having a macro cell structure according to Embodiment 3 of the present invention. In the drawing, reference numerals 41*a*, 41*b* each denote a extended diffusion region having a width C' corresponding to about half of the minimum permissible width C on a design rule, symbol E designates a width of a region eliminating diffusion widths 41*a*, 41*b* in the macro cell. The same reference numerals above designate the same components or corresponding parts, and their explanation is omitted herein for brevity.

The layout configuration of Embodiment 3 is distinguishable from that of Embodiment 2 in that the extended diffusion regions 41*a*, 41*b* have a narrow width C' of about half the minimum permissible width C of the extended diffusion regions 4*a*', 4*b*' in the configuration of the above Embodiment 2. The present embodiment is the same as the former in other layout configurations and macro cell structures. Accordingly, a description of their operation is omitted in the macro cell. Needless to say, the diffusion regions 41*a*, 41*b* having the width C' narrower than the minimum permissible width C above is incapable of disposing contacts.

Figure 7:
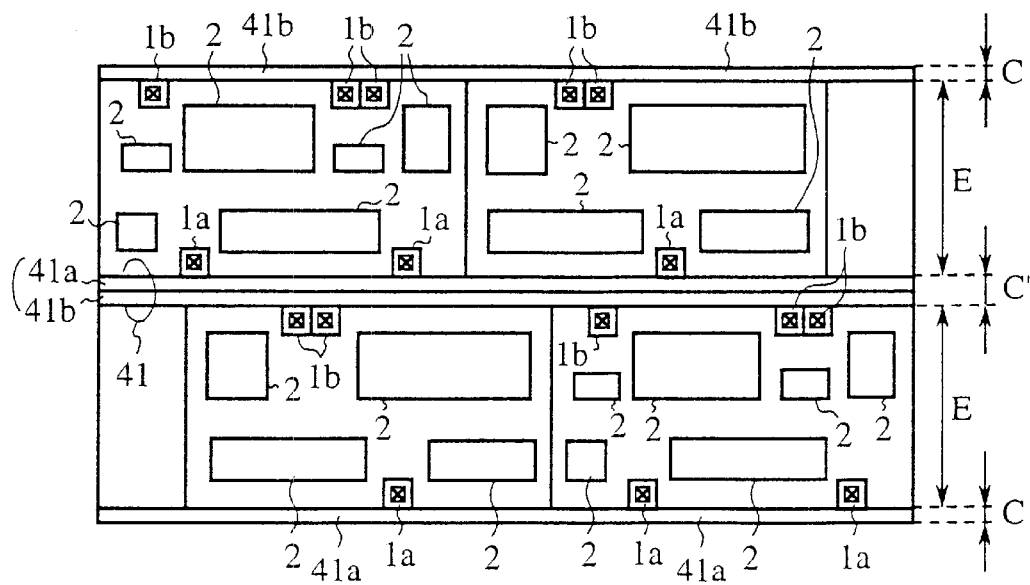
FIG. 7 is a layout diagram showing an application example of Embodiment 3.
Figure 8:
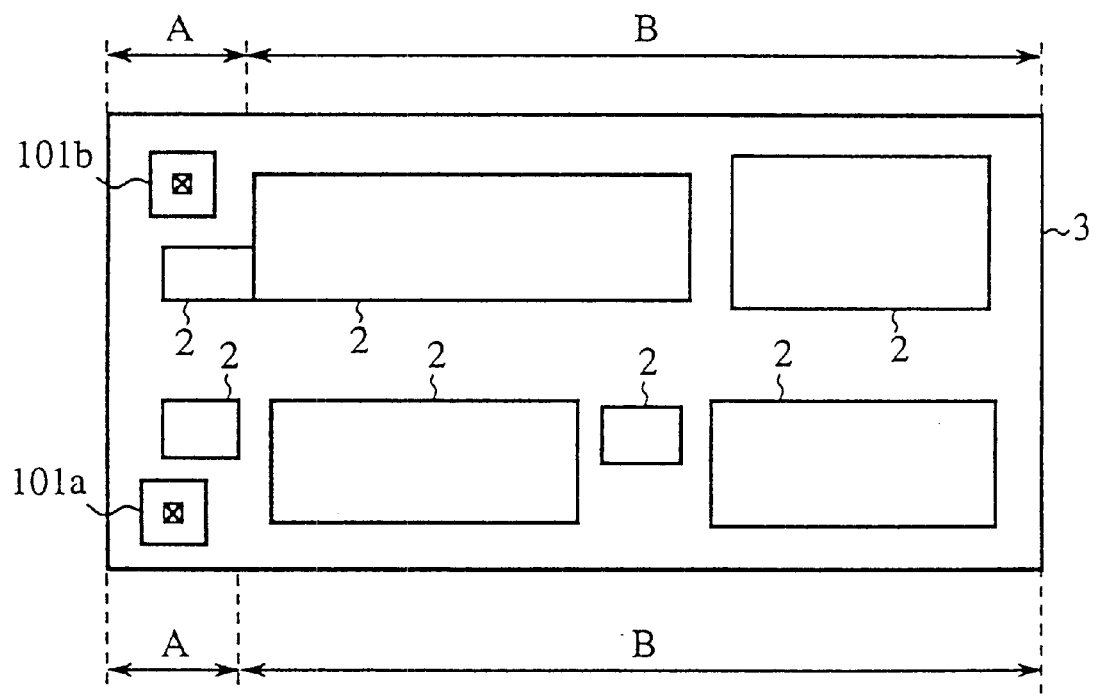
FIG. 8 is a layout diagram showing a prior art semiconductor integrated circuit device having a macro cell structure.
Figure 9:
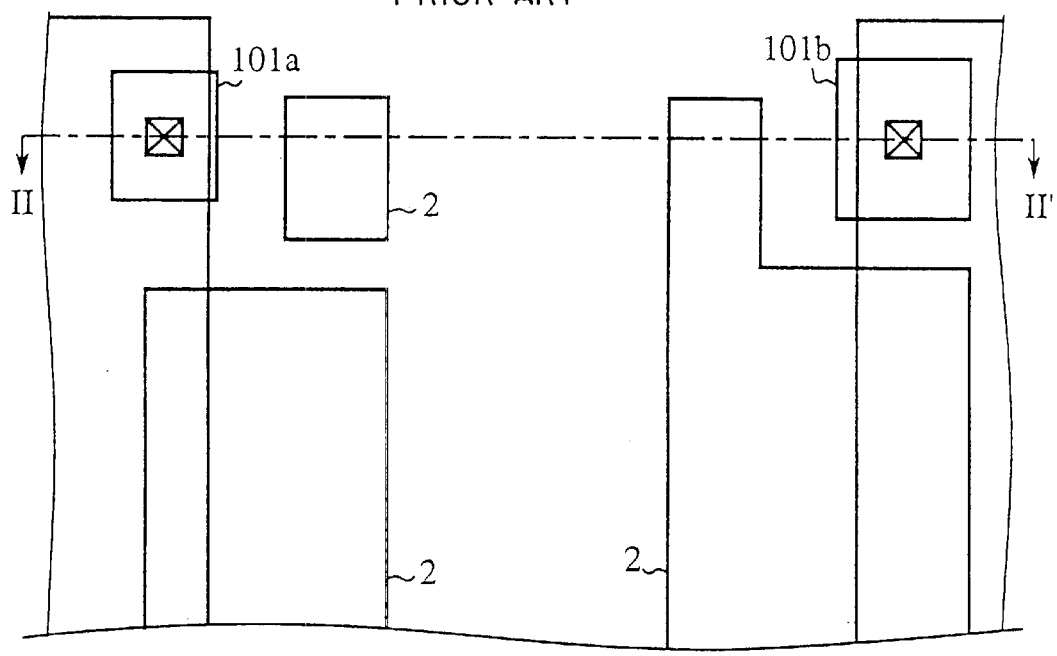
FIG. 9 is an enlarged view in left-part of the prior art semiconductor integrated circuit device of FIG. 8.
Figure 10:
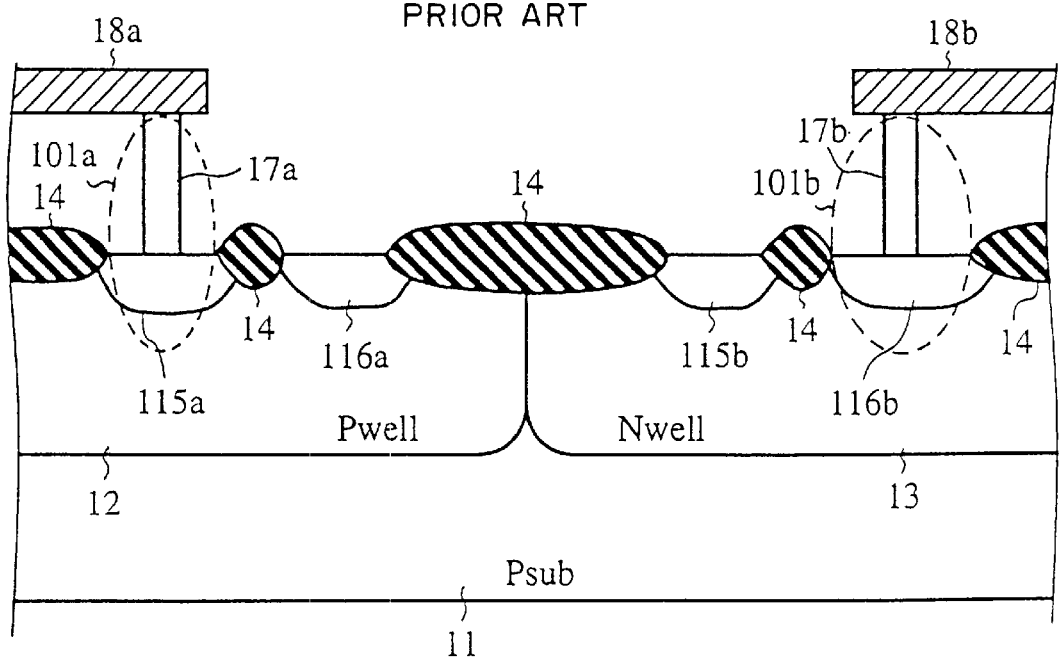
FIG. 10 is a sectional view taken along II–II' line of FIG. 9.

Referring to FIG. 7, the effects due to the above-mentioned structure will be explained below.

The macro cells having the macro cell structure in FIG. 6 are disposed vertically, to connect the extended diffusion region 41*b* of the upper macro cell with the extended diffusion region 41*a* of the lower macro cell, resulting in satisfying the minimum permissible width C on a design rule. Further, as a result of the above connection, the connected diffusion regions having the minimum permissible width C are electrically connected with other neighboring macro cells, and thereby a semiconductor integrated circuit device combined with a plurality of macro cells may be achieved.

By employing the above-mentioned structure, the width E of regions other than the extended diffusion regions 41*a*, 41*b* each having the minimum permissible width C is formed greater than that in the above Embodiments 1, 2, and the macro cells may be formed smaller since a poly-wiring region made of polysilicon and so on in the macro cell is made wider. Therefore, the latchup resistance may be improved, and a high density in semiconductor chips may be achieved as compared with the above Embodiments 1, 2.

The macro cell having the well contacts 1*a*, 1*b* described in FIG. 7 is alterable by a composite structure including the macro cells having no well contacts as described in the above Embodiment 2.

As described above, according to Embodiment 3, since in the cell frame 3 the macro cells having the extended diffusion regions 41a, 41b each of which the width C' is half the minimum extended region C are brought vertically in contact with each other to make electrical connections, the poly-wiring region increases in the macro cell, and thereby more poly-wirings may be disposed in the poly-wiring region. As a result, the latchup resistance and high density of the whole semiconductor integrated circuit device may be improved.

Embodiment 4

In the above Embodiments 1–3, the extended diffusion regions 4a, 4b, 4a', 4b', 41a, 41b in the p-type semiconductor substrate of Si are produced through typical field isolations. These regions are transformed into a composition with a refractory metal such as Mo, W, or Ti through salicide processes, and provided by a refractory metal compound such as MoSi2, WSi2, or TiSi2. Thus, an electric resistance in each surface area of the above extended diffusion regions 4a, 4b, 4a', 4b', 41a, 41b may be reduced. A salicide process is a process wherein silicon is transformed into a compound with a refractory metal.

Similarly, when the p+ diffusion region 15a and the n+ diffusion region 16b which correspond to the diffusion layers of the well contacts 1a, 1b are subjected to the salicide process, the electric resistance of the surface area may be reduced. In addition, the p+ diffusion region 15a and the n+ diffusion region 16b are electrically connected with the extended diffusion regions 4a, 4b, 4a', 4b', 41a, 41b; thus the latchup resistance of the semiconductor integrated circuit devices having the macro cell structures described in Embodiments 1–3 may be further improved.

Furthermore, since the minimum permissible width C by employing the above salicide processes is provided with a smaller width as compared with the extended diffusion regions 4a, 4b, 4a', 4b', 41a, 41b simply formed in the silicon substrate, the region E is ensured with a still larger level. Thus, since poly-wiring regions such as polysilicon in the macro cell are expanded, the macro cell is provided with a more compact version. Therefore, even though improvements in the latchup resistance are maintained, a higher chip density of the semiconductor integrated circuit device may be expected as compared with Embodiments 1–3.

As described above, according to Embodiment 4, in the structure of the macro cells in Embodiments 1–3 the extended diffusion regions 4a, 4b, 4a', 4b', 41a, 41b, and the p+ diffusion region 15a and n+ diffusion region 16b are subjected to the salicide processes, and the electric resistance of the surface areas of these regions may be reduced. Thus, the effect of the well contacts spreads over a still wider range, so that the latchup resistance of the semiconductor integrated circuit device is improved. Further, the occupied area of the macro cells is reduced due to decrease of the minimum permissible width, thereby performing a high density of the semiconductor integrated circuit device.

What is claimed is:

1. A semiconductor integrated circuit having a macro cell structure, said structure comprising:
   a semiconductor substrate;
   a rectangular macro cell region formed on a principal plane of said substrate;
   a first diffusion region formed within the semiconductor substrate and apart from both left and right side ends in upper and lower sides of said macro cell region, and formed in a vicinity of both upper and lower ends of said macro cell region; and
   a second diffusion region formed within the semiconductor substrate and in which a well contact is formed,
   wherein said first diffusion region is electrically connected within the semiconductor substrate to said second diffusion region.

2. A semiconductor integrated circuit having a macro cell structure, said structure comprising:
   a semiconductor substrate;
   a rectangular macro cell region formed on a principal plane of said substrate;
   a first diffusion region formed within the semiconductor substrate, formed from at least one of both left and right side ends in upper and lower sides of said macro cell region, and formed in a vicinity of both upper and lower ends of said macro cell region; and
   a second diffusion region formed within the semiconductor substrate and in which a well contact is formed,
   wherein said first diffusion region is electrically connected within the semiconductor substrate to said second diffusion region.

3. A semiconductor integrated circuit device according to claim 2, further comprising a second macro cell structure without a well contact, said second macro cell structure including: a rectangular macro cell region formed on said principal plane; and a third diffusion region having a permissible width, formed from at least one of both left and right side ends in upper and lower sides of said macro cell region, and formed in a vicinity of both upper and lower ends of said macro cell region, wherein when said macro cell structure is disposed at at least any one of left and right sides of said second macro cell structure, said first diffusion region is electrically connected with said third diffusion region in upper side and/or lower side of said macro cell region.

4. A semiconductor integrated circuit according to claim 3, further comprising
   a fourth diffusion region formed from at least one of both left and right side ends in upper and lower sides of said macro cell region, and formed in a vicinity of both upper and lower ends of said macro cell region.

5. A semiconductor integrated circuit device according to claim 4, further comprising a plurality of said macro cell structures in which a fifth diffusion region is formed in such a manner that said fourth diffusion regions are electrically connected with each other at upper and lower sides of said macro cell region, said fifth diffusion region satisfying said minimum permissible width.

6. A semiconductor integrated circuit device according to claim 5, wherein said fifth diffusion regions are electrically connected with each other at left and right sides of said macro cell region.

7. A semiconductor integrated circuit device according to claim 5, wherein said plurality of macro cell structures include a macro cell structure having no well contacts.

8. A semiconductor integrated circuit device according to claim 5, wherein at least one of said first to fifth diffusion regions is made of a salicide structure of a refractory metal to reduce electric resistance of these surface layers.

9. A semiconductor integrated circuit device according to claim 5, wherein a width of said first, third, fourth and fifth diffusion regions is not allowed to be disposed with a well contact.

* * * * *